US012515297B1

(12) United States Patent
Yu et al.

(10) Patent No.: US 12,515,297 B1
(45) Date of Patent: Jan. 6, 2026

(54) SAND BLASTING FIXTURE AND METHOD OF MANUFACTURING PACKAGE LEAD FRAMES USING THE SAME

(71) Applicant: Jentech Precision Industrial Co., LTD., Taoyuan (TW)

(72) Inventors: Chin-Jui Yu, Taoyuan (TW); Jheng-Dong Huang, Taoyuan (TW); Tung Jung Wu, Taoyuan (TW)

(73) Assignee: Jentech Precision Industrial Co., LTD., Taoyuan (TW)

( * ) Notice: Subject to any disclaimer, the term of this patent is extended or adjusted under 35 U.S.C. 154(b) by 0 days.

(21) Appl. No.: 19/026,595

(22) Filed: Jan. 17, 2025

(30) Foreign Application Priority Data

Sep. 11, 2024 (TW) .................................. 113134480

(51) Int. Cl.
*H01L 21/48* (2006.01)
*B24C 9/00* (2006.01)

(52) U.S. Cl.
CPC ............ *B24C 9/00* (2013.01); *H01L 21/4828* (2013.01); *H01L 21/4842* (2013.01)

(58) Field of Classification Search
CPC ............ H01L 21/4828; H01L 21/4842; H01L 21/4839; B24C 9/00
See application file for complete search history.

(56) References Cited

U.S. PATENT DOCUMENTS

2023/0197575 A1* 6/2023 Molina ............. H01L 23/49861
257/673
2024/0355639 A1* 10/2024 Yu ........................ H10H 20/857

FOREIGN PATENT DOCUMENTS

| CN | 101691027 B | 10/2011 |
|----|----|----|
| CN | 109037084 A | 12/2018 |
| JP | 2014-110302 A | 6/2014 |
| JP | 2020-28936 A | 2/2020 |
| JP | 2021-121459 A | 8/2021 |
| JP | 2023-131761 A | 9/2023 |
| TW | I587414 B | 6/2017 |
| TW | I827986 B | 1/2024 |
| TW | I841359 B | 5/2024 |

* cited by examiner

*Primary Examiner* — Christopher J. Besler
(74) *Attorney, Agent, or Firm* — CKC & Partners Co., LLC

(57) ABSTRACT

A sand blasting fixture is used to allow a half-etched elongated slit of a lead frame to be processed a sandblasting operation, and includes a lower mold, an upper mold and a positioning component. The lower mold includes a lower cover plate. The upper mold includes an upper cover plate and a sandblasting elongated hole. The upper cover plate is removably covered by the lower cover plate, the sandblasting elongated hole is penetrated through the upper cover plate, and featured with the same appearance with the half-etched elongated slit. The positioning component is connected to the upper cover plate for fixing the lead frame on the upper cover plate so that the upper cover plate is allowed to completely cover one surface of the lead frame and the half-etched elongated slit is completely overlapped and exposes from the sandblasting elongated hole of the upper cover plate.

5 Claims, 12 Drawing Sheets

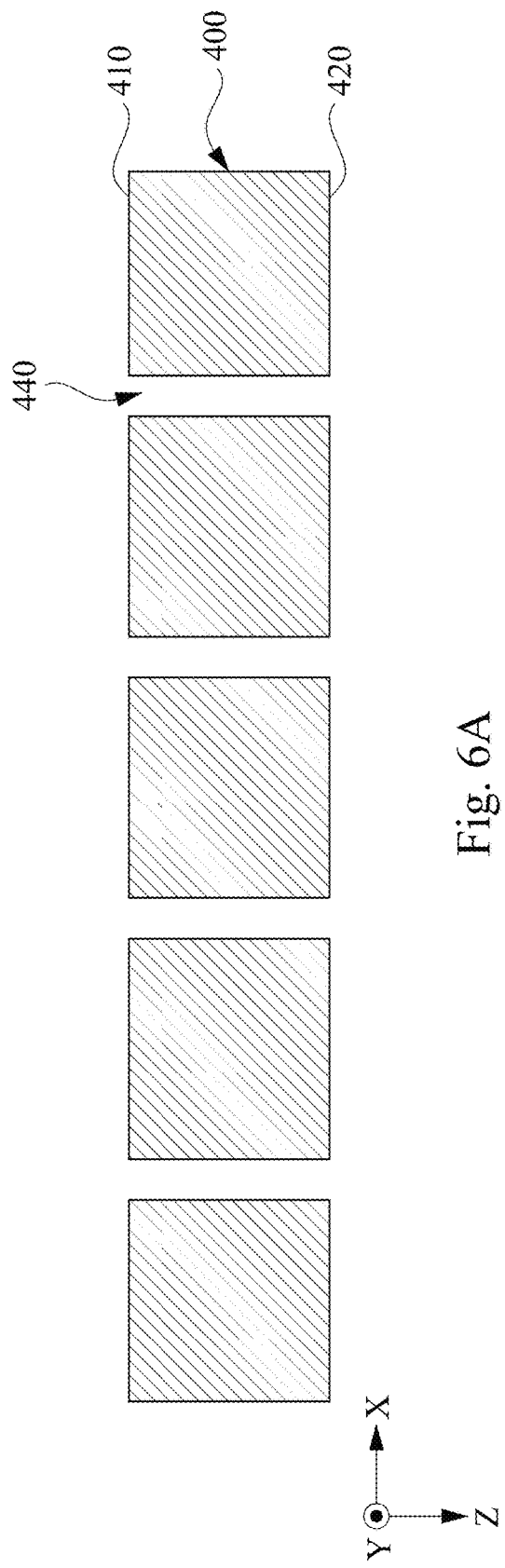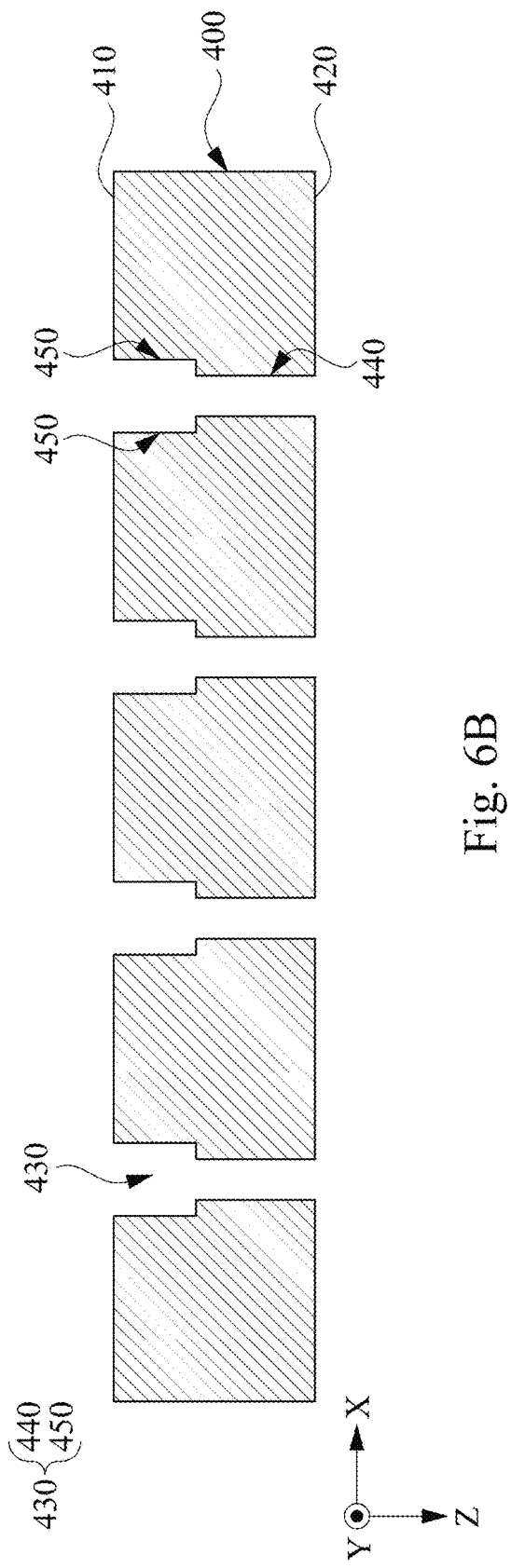
Fig. 6A
Fig. 6B

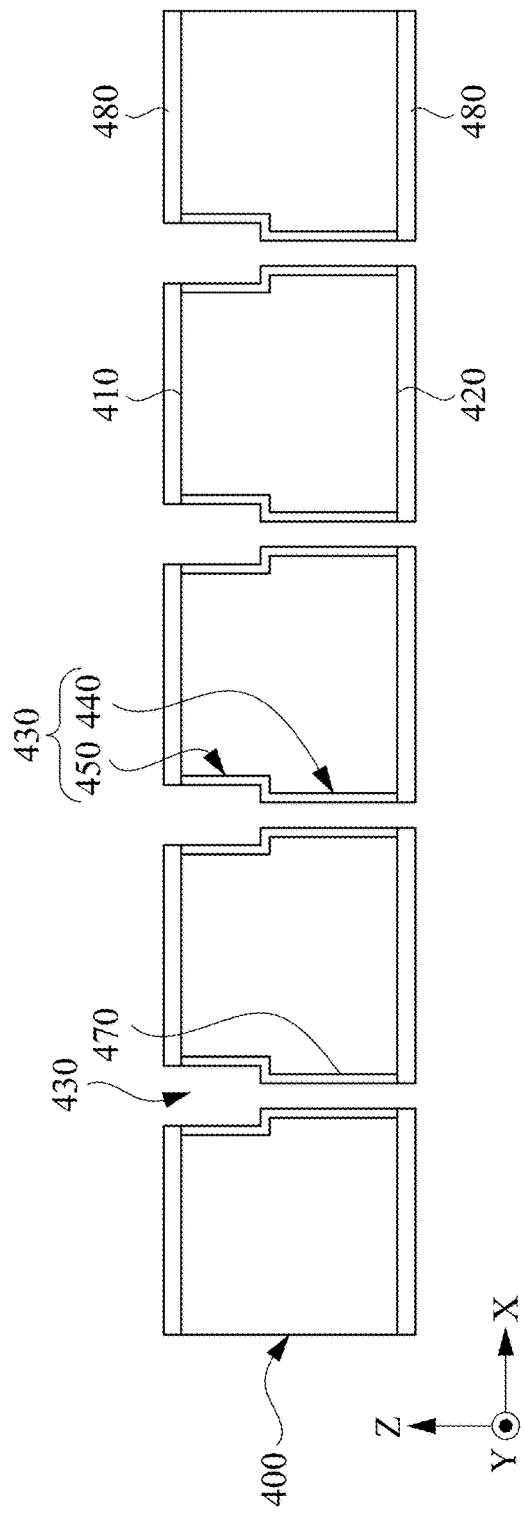
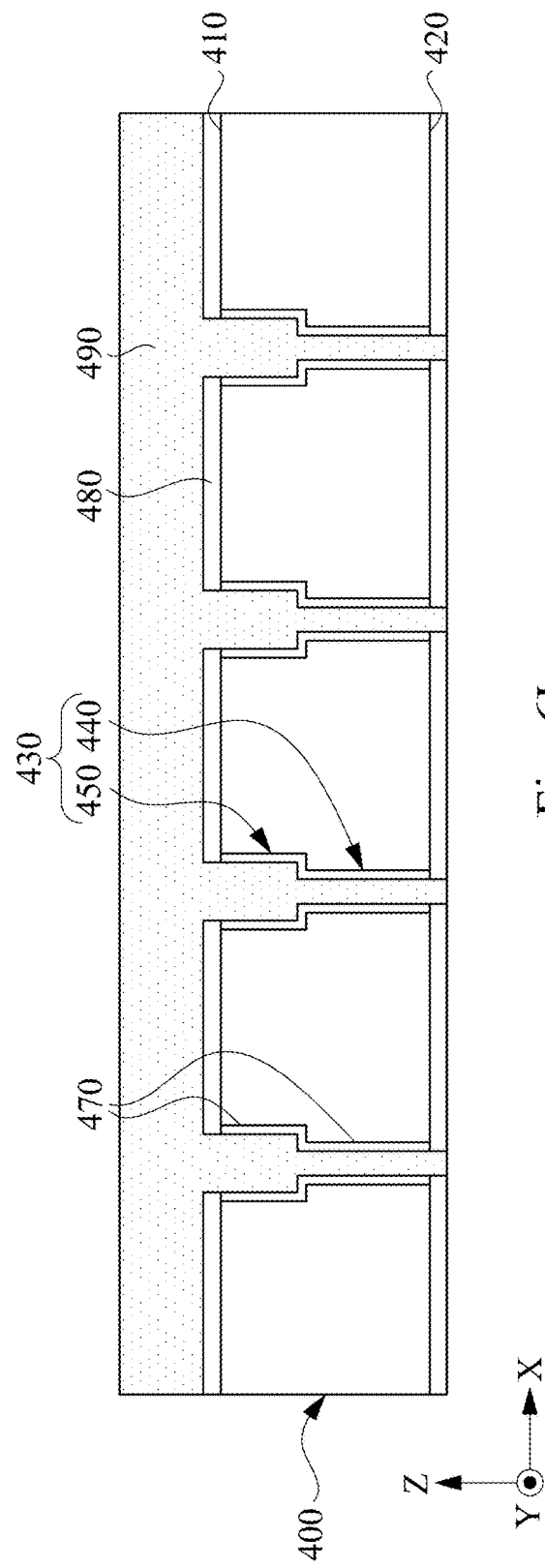
Fig. 6H
Fig. 6I

SAND BLASTING FIXTURE AND METHOD OF MANUFACTURING PACKAGE LEAD FRAMES USING THE SAME

RELATED APPLICATIONS

This application claims priority to Taiwan Application Serial Number 113134480, filed Sep. 11, 2024, the disclosures of which are incorporated herein by reference in their entireties.

BACKGROUND

Field of Invention

The present disclosure relates to a sand blasting fixture. More particularly, the present disclosure relates to a sand blasting fixture and a method of manufacturing package lead frames using the same.

Description of Related Art

Generally, a surface roughening treatment will be processed on the opening positions of the metal substrate during the manufacturing process of the lead frame, so that the molded packaging material can be stably attached to the lead frame during subsequent press-molding.

However, when the surface roughening treatment with insufficient positional accuracy is performed on a metal substrate, unexpected locations on the outer surface of the metal substrate may be roughened instead, thereby reducing the yield, reliability and packaging reliability of the lead frame.

Thus, the above-mentioned technology obviously still has inconveniences and defects, which are issues that the industry needs to solve urgently. Therefore, how to effectively solve the above inconveniences and defects is indeed one of the current important research and development topics, and become an urgent need for improvement in related fields.

SUMMARY

One aspect of the present disclosure is to provide a sand blasting fixture and a method of manufacturing package lead frames using the same for solving the difficulties mentioned above in the prior art.

In one embodiment of the present disclosure, a method of manufacturing package lead frames includes several steps as follows. A lead frame is provided. A through trench is formed on the lead frame. A half etching process is performed on the lead frame so that at least one elongated step portion is concavely formed on an outer side of the through trench, wherein the at least one elongated step portion is in communicated with the through trench to form a half-etched elongated slit together. The lead frame is installed inside a sand blasting fixture, wherein the lead frame is sandwiched between a lower cover plate and an upper cover plate of the sand blasting fixture, and the upper cover plate completely covers one surface of the lead frame to allow the half-etched elongated slit to be completely overlapped and exposed from a sandblasting elongated hole of the upper cover plate. A sandblasting operation is performed on the half-etched elongated slit in the sandblasting elongated hole, so that a roughed surface is formed on the elongated step portion. A pre-coating layer formed onto the lead frame. A press- molding process performed to the lead frame so that a polymer material is attached to the half-etched elongated slit and the roughed surface.

According to one or more embodiments of the present disclosure, in the method of manufacturing package lead frames, the sandblasting operation is performed on the half-etched elongated slit, only after forming the pre-coating layer onto the lead frame.

According to one or more embodiments of the present disclosure, in the method of manufacturing package lead frames, the pre-coating layer is formed onto the lead frame only after the sand blasting fixture is removed from the lead frame.

According to one or more embodiments of the present disclosure, in the method of manufacturing package lead frames, the step of the sandblasting operation performed on the half-etched elongated slit further includes steps as follows. The sand blasting fixture installed with the lead frame therein is moved into a processing range of a dry sandblaster, and the dry sandblaster is faced towards the sandblasting elongated hole of the upper cover plate. A plurality of sand grains are sprayed into the half-etched elongated slit in the sandblasting elongated hole by using the dry sandblaster so as to collide with the elongated step portion to form the roughed surface.

According to one or more embodiments of the present disclosure, in the method of manufacturing package lead frames, the lead frame installed inside the sand blasting fixture further includes steps as follows. The upper cover plate is placed on a loading tray so that a lower surface of the upper cover plate is arranged opposite to the loading tray. The lead frame is placed on the lower surface of the upper cover plate so that positioning pins of the upper cover plate are respectively inserted into positioning holes of the lead frame. The lower cover plate is covered on the lead frame and the upper cover plate so that the lead frame is sandwiched between the lower cover plate and the upper cover plate of the sand blasting fixture, and the positioning pins of the upper cover plate respectively passing through the lead frame are inserted into pin holes of the lower cover plate, respectively. The sand blasting fixture installed with the lead frame back is turned over and disposed on the loading tray, so that the sandblasting elongated hole of the upper cover plate is arranged opposite to the loading tray.

In one embodiment of the present disclosure, a method of manufacturing package lead frames includes several steps as follows. A lead frame is provided, and the lead frame is formed with a plurality of half-etched elongated slits thereon, and two opposite outer sides of each of the half-etched elongated slits provided with elongated step portions, respectively. The lead frame is fixedly installed inside a sand blasting fixture, and one surface of the lead frame inside the sand blasting fixture is completely covered by the sand blasting fixture, only the half-etched elongated slits of the lead frame are completely overlapped and exposed from sandblasting elongated holes formed on a main surface of the sand blasting fixture, respectively. A large amount of high-pressure sand grains is sprayed towards the main surface of the sand blasting fixture and the half-etched elongated slits so that outer surfaces of the elongated step portions of the half-etched elongated slits are formed with rough structures thereon. A package is wrapped on the lead frame after the rough structures are formed, so that the half-etched elongated slits and the rough structures are covered to be integrated with the package.

According to one or more embodiments of the present disclosure, the method of manufacturing package lead frames further includes a pre-coating layer formed onto the surface of the lead frame only before the lead frame is fixedly installed inside the sand blasting fixture.

According to one or more embodiments of the present disclosure, the method of manufacturing package lead frames further includes a pre-coating layer formed onto the surface of the lead frame only after the sand blasting fixture is removed from the lead frame.

According to one or more embodiments of the present disclosure, in the method of manufacturing package lead frames, the step of the large amount of the high-pressure sand grains sprayed towards the main surface of the sand blasting fixture and the half-etched elongated slits further includes steps as follows. The sand blasting fixture with the lead frame therein is moved in a processing range of a dry sandblaster that is faced towards the main surface of the sand blasting fixture and the sandblasting elongated holes. The sand grains are concentratedly sprayed into each of the half-etched elongated slits in one of the sandblasting elongated holes by using the dry sandblaster so as to collide with the corresponding elongated step portion to form the rough structure, respectively.

According to one or more embodiments of the present disclosure, in the method of manufacturing package lead frames, the lead frame is fixedly installed inside the sand blasting fixture further includes a step that the lead frame is sandwiched by a lower cover plate and an upper cover plate of the sand blasting fixture.

According to one or more embodiments of the present disclosure, in the method of manufacturing package lead frames, the lead frame fixedly installed inside the sand blasting fixture further includes steps as follows. Positioning pins of the upper cover plate are passed through positioning holes of the lead frame respectively, and then are inserted into pin holes of the lower cover plate, respectively so that the lead frame is fixedly sandwiched between the upper cover plate and the lower cover plate.

In one embodiment of the present disclosure, a sand blasting fixture is used to allow a half-etched elongated slit of a lead frame to be processed a sandblasting operation, and the sand blasting fixture includes a lower mold, an upper mold and a positioning component. The lower mold includes a lower cover plate. The upper mold includes an upper cover plate and a sandblasting elongated hole. The upper cover plate is removably covered by the lower cover plate, the sandblasting elongated hole is penetrated through the upper cover plate, and featured with the same appearance with the half-etched elongated slit. The positioning component is connected to the upper cover plate for fixing the lead frame on the upper cover plate so that the upper cover plate is allowed to completely cover one surface of the lead frame and the half-etched elongated slit is completely overlapped and exposes from the sandblasting elongated hole of the upper cover plate.

According to one or more embodiments of the present disclosure, in the sand blasting fixture, the positioning component includes a plurality of positioning pins spaced arranged on a lower surface of the upper cover plate. Each of the positioning pins extends from the lower surface of the upper cover plate to the lower cover plate for passing through one of the positioning holes of the lead frame. The lower mold includes a plurality of pin holes spaced arranged on a upper surface of the lower cover plate, and each of the pin holes is coaxially aligned with and receiving one of the positioning pins.

According to one or more embodiments of the present disclosure, in the sand blasting fixture, a minimum gap is defined between one of the positioning pins and an inner wall of one of the pin holes, and the minimum gap is 0.01 mm to 0.03 mm.

According to one or more embodiments of the present disclosure, in the sand blasting fixture, at least three of the positioning pins are arranged in a triangle pattern.

According to one or more embodiments of the present disclosure, in the sand blasting fixture, the lower mold further includes a sand discharging hole penetrated through the lower cover plate, and connected to the sandblasting elongated hole for discharging sand grains passing through the half-etched elongated slit.

According to one or more embodiments of the present disclosure, in the sand blasting fixture, the sand discharging hole is arranged between the positioning pins.

Thus, through the construction of the embodiments above, the sand blasting fixture of the disclosure allows a part of sandblasting operations to be performed with high precision, that is half-etched elongated slits opened on an outer surface of the lead frame can be accurately exposed. Thus, since outer surface of the lead frame can be prevented from being unintentionally exposed, the smoothness of the outer surface of the lead frame can be maintained, and the brightness of the product can be kept and leakage can be improved together, thereby improving the yield, reliability and packaging reliability of the lead frame.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

FIG. 6A to FIG. 6I are operational schematic diagrams of step 501 to 507 viewed in FIG. 5.

DETAILED DESCRIPTION

Figure 1:
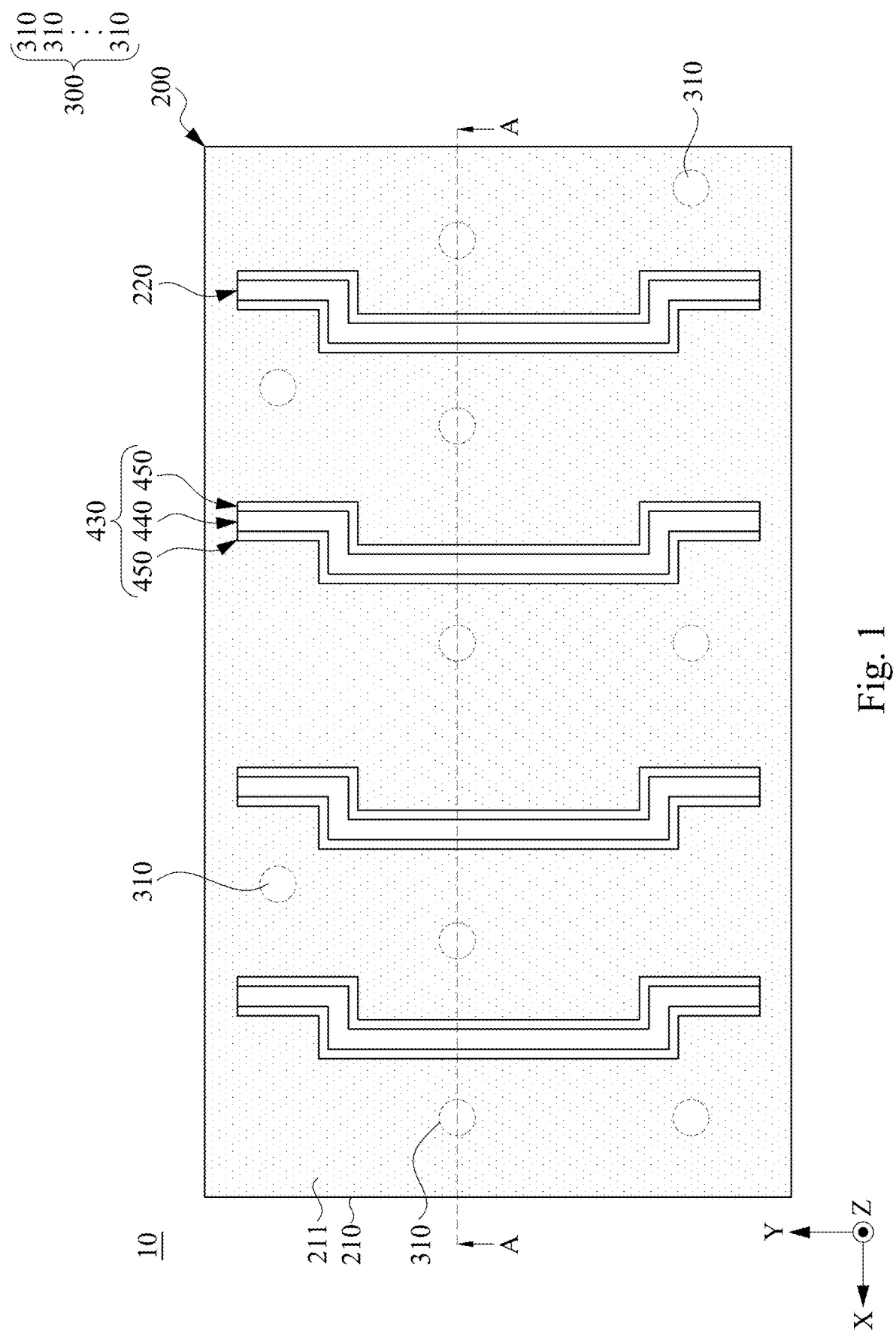
FIG. 1 is a top view of a sand blasting fixture according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
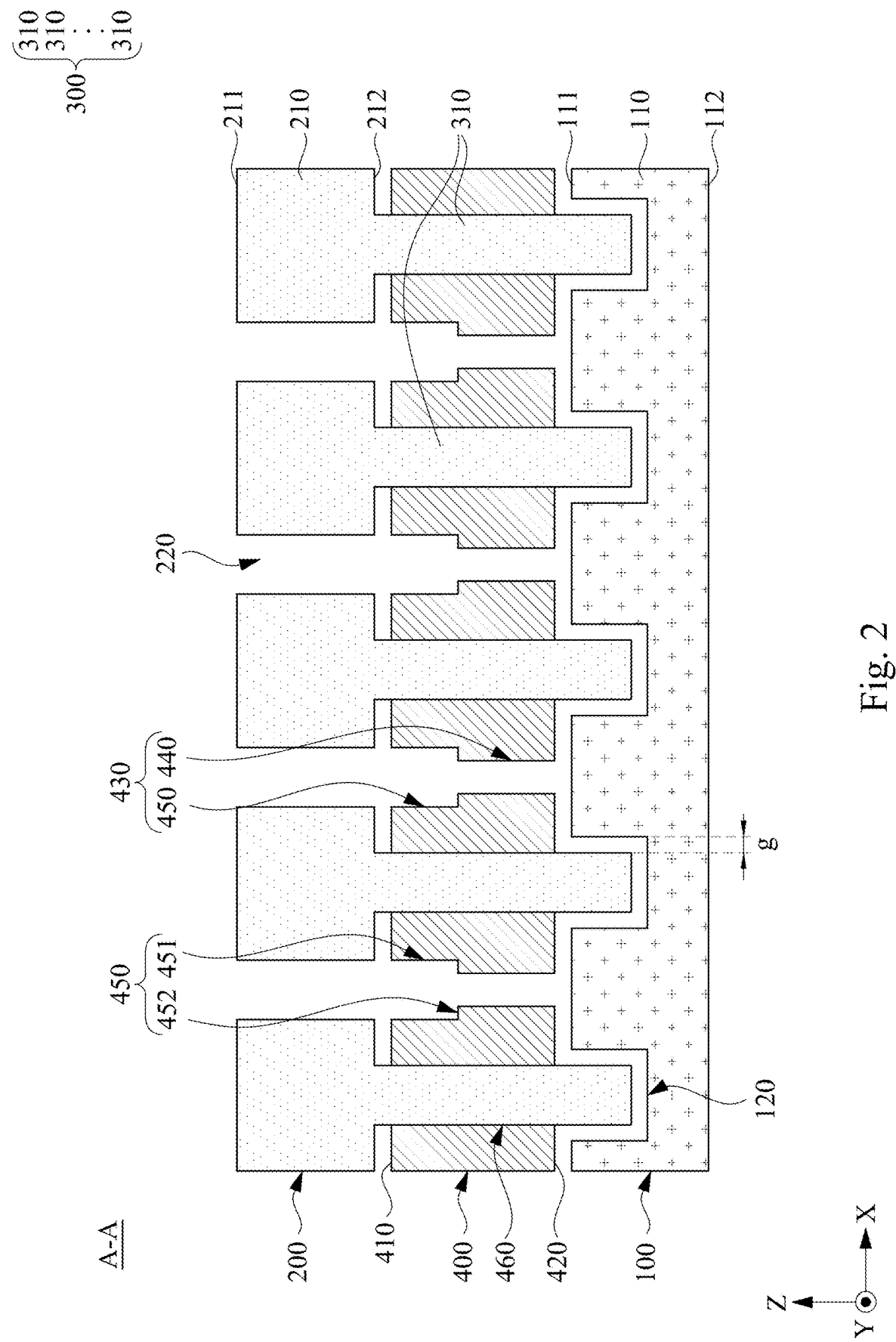
FIG. 2 is a partial cross-section view of FIG. 1 taken along a line AA.
Figure 3:
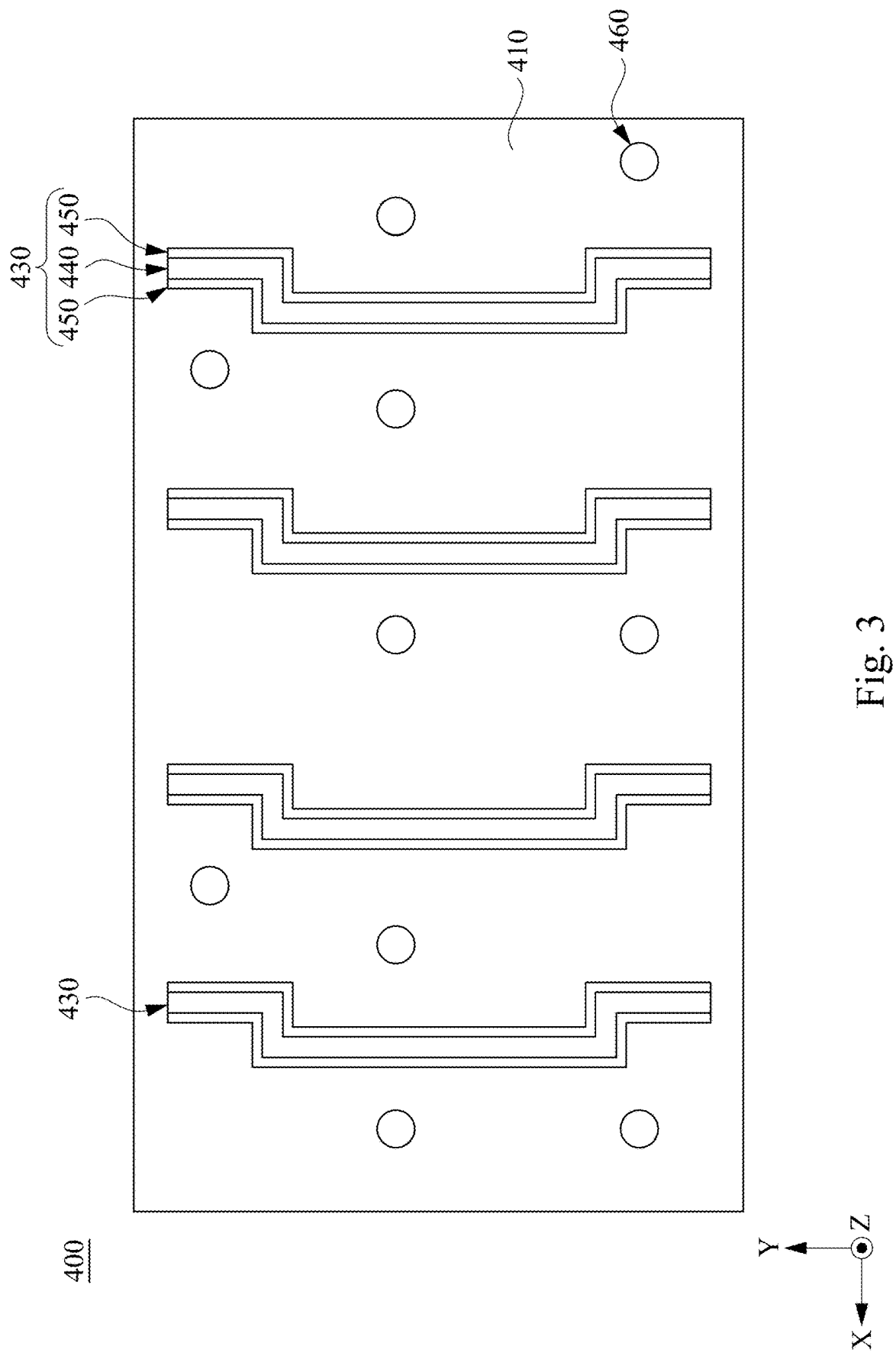
FIG. 3 is a top view of a lead frame of FIG. 2.

Reference is now made to FIG. 1 to FIG. 3, in which FIG. 1 is a top view of a sand blasting fixture 10 according to one embodiment of the present disclosure. FIG. 2 is a partial cross-section view of FIG. 1 taken along a line AA. FIG. 3 is a top view of a lead frame 400 of FIG. 2. As shown in FIG. 1 to FIG. 3, in this embodiment, a sand blasting fixture 10 is used to allow a half-etched elongated slit 430 of a lead frame 400 to be processed a sandblasting operation, and the sand blasting fixture 10 includes a lower mold 100, an upper mold 200 and a positioning component 300. The lower mold 100 includes a lower cover plate 110. The lower cover plate 110 is provided with a first upper surface 111 and a first lower surface 112 opposite to each other. The upper mold 200 includes an upper cover plate 210 and a plurality of sandblasting elongated holes 220. The upper cover plate 210 is provided with a second upper surface 211 and a second lower surface 212 opposite to each other. The upper cover plate 210 is removably covered by the lower cover plate 110. These sandblasting elongated holes 220 are spaced arranged on the upper cover plate 210 along an X-axis. Each of the sandblasting elongated holes 220 substantially is extended along a Y-axis on the upper cover plate 210. Each of the sandblasting elongated holes 220 is penetrated through the upper cover plate 210 along a Z-axis, that is, each of the sandblasting elongated holes 220 is respectively connected to the second upper surface 211 and the second lower surface 212 of the upper cover plate 210. Each of the sandblasting elongated holes 220 is featured with the same appearance with the corresponding half-etched elongated slit 430, that is, an outline shape and a size of each of the sandblasting elongated holes 220 are the same as the corresponding half-etched elongated slit 430. The positioning component 300 is connected to the upper cover plate 210 for fixedly positioning the lead frame 400 on the upper cover plate 210, and rendering the sandblasting elongated hole 220 and the corresponding half-etched elongated slit 430 coaxially aligned with each other. In this embodiment, the upper cover plate 210 and the lower cover plate 110 are made of metal or similar materials, for example. However, the disclosure is not limited to the materials of the upper cover plate 210 and the lower cover plate 110.

In this way, when the lead frame 400 is sandwiched between the upper cover plate 210 and the lower cover plate 110, through the positioning by the positioning component 300, the upper cover plate 210 is allowed to completely cover one surface of the lead frame 400 and the half-etched elongated slit 430 is completely overlapped and exposes from the sandblasting elongated hole 220 of the upper cover plate 210. Therefore, the sand blasting fixture 10 can render the half-etched elongated slits 430 of the lead frame 400 to be processed the sandblasting operation without damaging the surface of the lead frame 400.

More specifically, the lead frame 400 is in a sheet shape and the lead frame 400 includes a top surface 410 and a bottom surface 420 that are opposite to each other, and the top surface 410 and the bottom surface 420 are smooth surfaces respectively. For example, the lead frame 400 is a metal substrate or a ceramic substrate. The lead frame 400 is further formed with a plurality of half-etched elongated slits 430 are spaced apart from each other. Each of the half-etched elongated slits 430 includes a through trench 440 and two elongated step portions 450. The through trench 440 is connected to the top surface 410 and the bottom surface 420 of the lead frame 400, and located between the elongated step portions 450. Each of the through trenches 440 substantially extends on the bottom surface 420 of the lead frame 400 along the Y-axis. Each of the elongated step portions 450 is recessed on the top surface 410 of the lead frame 400, located outside the corresponding through trench 440, and connected to the corresponding through trench 440. Each of the elongated step portions 450 substantially extends on the bottom surface 420 of the lead frame 400 along the Y-axis. For example, each of the half-etched elongated slits 430 is in a "n" type shape on the top surface 410 of the lead frame 400 (FIG. 1), and the outlines of the elongated step portions 450 on both sides of one of the half-etched elongated slits 430 are consistent with each other (FIG. 3). Each of the elongated step portions 450 includes a straight inner wall 451 extending along the Z-axis, and a transverse inner wall 452 extending along the X-Y axis and connected to the straight inner wall 451 and the corresponding through trench 440.

More specifically, the positioning component 300 includes a plurality of positioning pins 310. These positioning pins 310 are spaced arranged on the second lower surface 212 of the upper cover plate 210. Each of the positioning pins 310 extends from the second lower surface 212 of the upper cover plate 210 to the lower cover plate 110. In this embodiment, these positioning pins 310 are respectively integrally connected to the second lower surface 212 of the upper cover plate 210. However, the disclosure is not limited thereto. The lower mold 100 includes a plurality of pin holes 120 spaced arranged on the first upper surface 111 of the lower cover plate 110. Each of the pin holes 120 is, for example, a blind hole, and is coaxially aligned with one of the positioning pins 310. The lead frame 400 includes a plurality of positioning holes 460 spaced apart from each other. Each of the positioning holes 460 is a through hole, and coaxially aligned with one of the positioning pins 310 and one of the pin holes 120.

Therefore, when the lead frame 400 is sandwiched between the upper cover plate 210 and the lower cover plate 110, each of the positioning pins 310 extends into one of the pin holes 120 through one of the positioning holes 460, so that the lead frame 400 is fixedly positioned on the upper cover plate 210, thereby reducing the possibilities of the top surface 410 of the lead frame 400 partially exposed from the sandblasting elongated holes 220 of the upper cover plate 210 due to vibration.

In this embodiment, at least three of the positioning pins are arranged in for example, a triangle pattern, thereby reducing the risk of the lead frame 400 being arbitrarily displaced along the plane of the X-Y axis between the upper cover plate 210 and the lower cover plate 110. However, the present disclosure is not limited to this.

In this embodiment, for example, a small gap g is defined between each of the positioning pins 310 and one of the pin holes 120, so that the upper mold 200 can be effectively fixed on the lower mold 100. However, the disclosure is not limited thereto. In other embodiments, the width of the positioning pin 310 may also be equal to the diameter of the corresponding pin hole 120. A minimum gap defined between one of the positioning pins 310 and an inner wall of one of the positioning holes 460 is less than 0.03 mm, or even in the range of 0.01 mm to 0.03 mm. However, the disclosure is not limited thereto.

However, the disclosure is not limited to this. In other embodiments, the design of the pin hole 120 may also be omitted in the lower mold 100; the positioning component 300 may also be changed to other mechanisms (such as magnets) to achieve the above positioning means.

Figure 4:
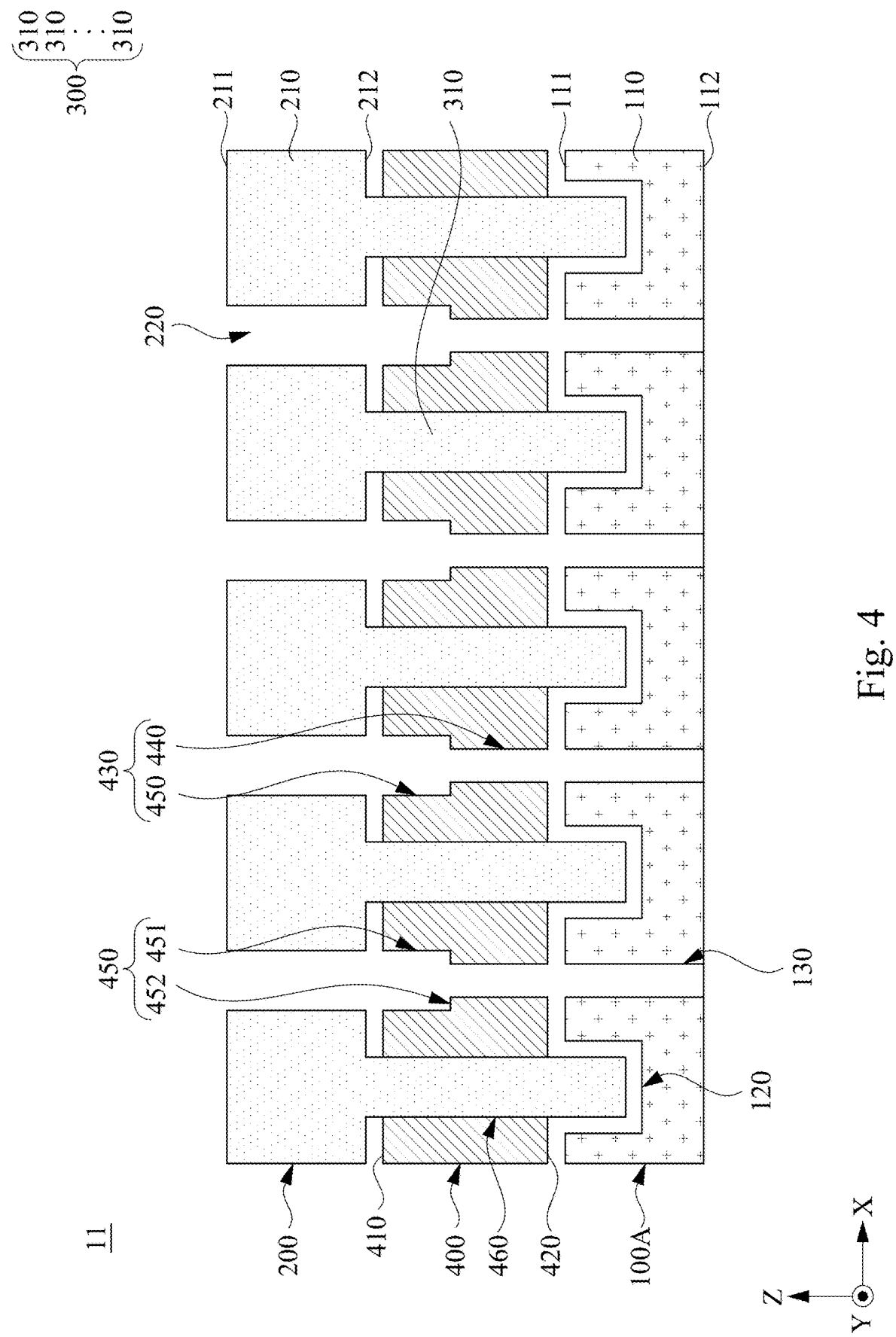
FIG. 4 is a cross-sectional view of a sand blasting fixture whose cross-sectional direction is the same as FIG. 3 according to one embodiment of the present disclosure.

FIG. 4 is a cross-sectional view of a sand blasting fixture 11 whose cross-sectional direction is the same as FIG. 3 according to one embodiment of the present disclosure. The embodiment of the sand blasting fixture 11 and the above embodiment of the sand blasting fixture 10 is the substantially the same, except that, the lower mold 100A in this embodiment further includes a plurality of sand discharge holes 130 spaced arranged on the lower cover plate 110 along the X-axis. Each sand discharge hole 130 is between any two pin holes 120 and connected to one of the sandblasting elongated holes 220 through the corresponding half-etched elongated slit 430. More specifically, each of the sand discharge holes 130 extends generally along the Y-axis, and each of the sand discharge holes 130 penetrates through the lower cover plate 110 along the Z-axis. That is, the sand discharge holes 130 are respectively connected to the first upper surface 111 and the first lower surface 112 of the lower cover plate 110. Therefore, when the half-etched elongated slit 430 of the lead frame 400 is performed with a sand-blasting operation, the sand grains passing through the half-etched elongated slit 430 can be discharged.

Figure 5:
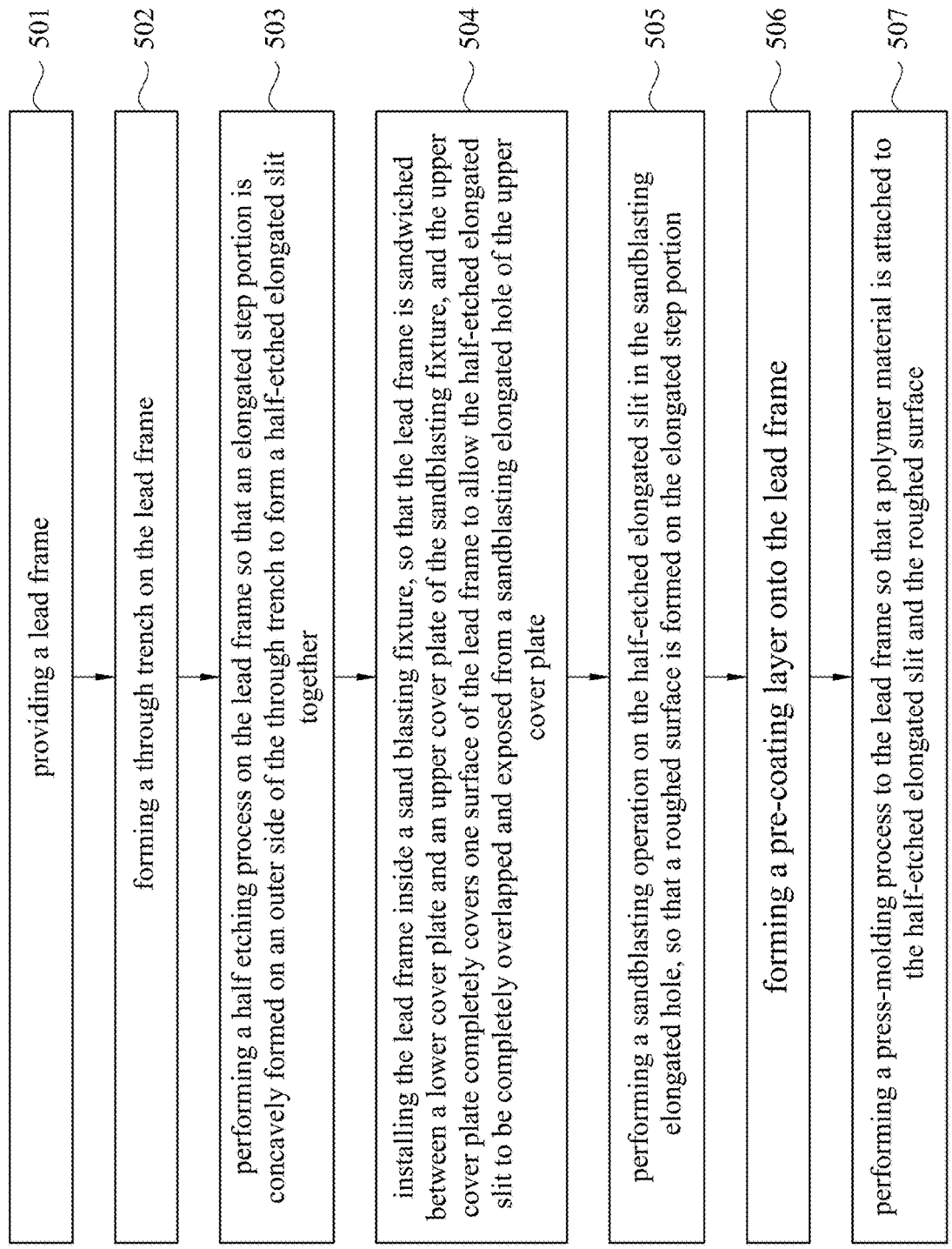
FIG. 5 is a flow chart of a method of manufacturing package lead frames according to one embodiment of the present disclosure.

FIG. 5 is a flow chart of a method of manufacturing package lead frames 400 according to one embodiment of the present disclosure. FIG. 6A to FIG. 6I are operational schematic diagrams of step 501 to 507 viewed in FIG. 5. As shown in FIG. 5, the method of manufacturing package lead frames 400 includes step 501 to step 507 as follows. In step 501, a lead frame 400 is provided. In step 502, a through trench 440 is formed on the lead frame 400. In step 503, a half etching process is performed on the lead frame 400 so that elongated step portions 450 are concavely formed on outer sides of the through trench 440 to form a half-etched elongated slit 430 together. In step 504, the lead frame 400 is installed inside a sand blasting fixture 11, and the lead frame 400 is sandwiched between the lower cover plate 110 and the upper cover plate 210, and the upper cover plate 210 completely covers one surface of the lead frame 400 to allow the half-etched elongated slit 430 to be completely overlapped and exposed from a sandblasting elongated hole 220 of the upper cover plate 210. In step 505, a sandblasting operation is performed on the half-etched elongated slit 430 in the sandblasting elongated hole 220, so that a roughed surface 470 is formed on the elongated step portions 450. In step 506, after the sand blasting fixture 10 is removed from the lead frame 400, a pre-coating layer formed onto the lead frame. In step 507, a press-molding process is performed to the lead frame so that a polymer material is attached to the half-etched elongated slit 430 and the roughed surface.

In step 502, more specifically, as shown in FIG. 6A, a full etching process is performed on the lead frame 400, so that each of the through trenches 440 penetrates through the lead frame 400 along the Z-axis, and is connected to the top surface 410 and the bottom surface 420 of the lead frame 400, respectively.

In step 503, more specifically, as shown in FIG. 6B, a local thinning process is performed on the two opposite sides of each of the through trench 440 towards the top surface 410 of the lead frame 400, so that these elongated step portions 450 are recessed in Z-axis but not yet penetrated through the bottom surface 420 of the lead frame 400.

Figure 6C:
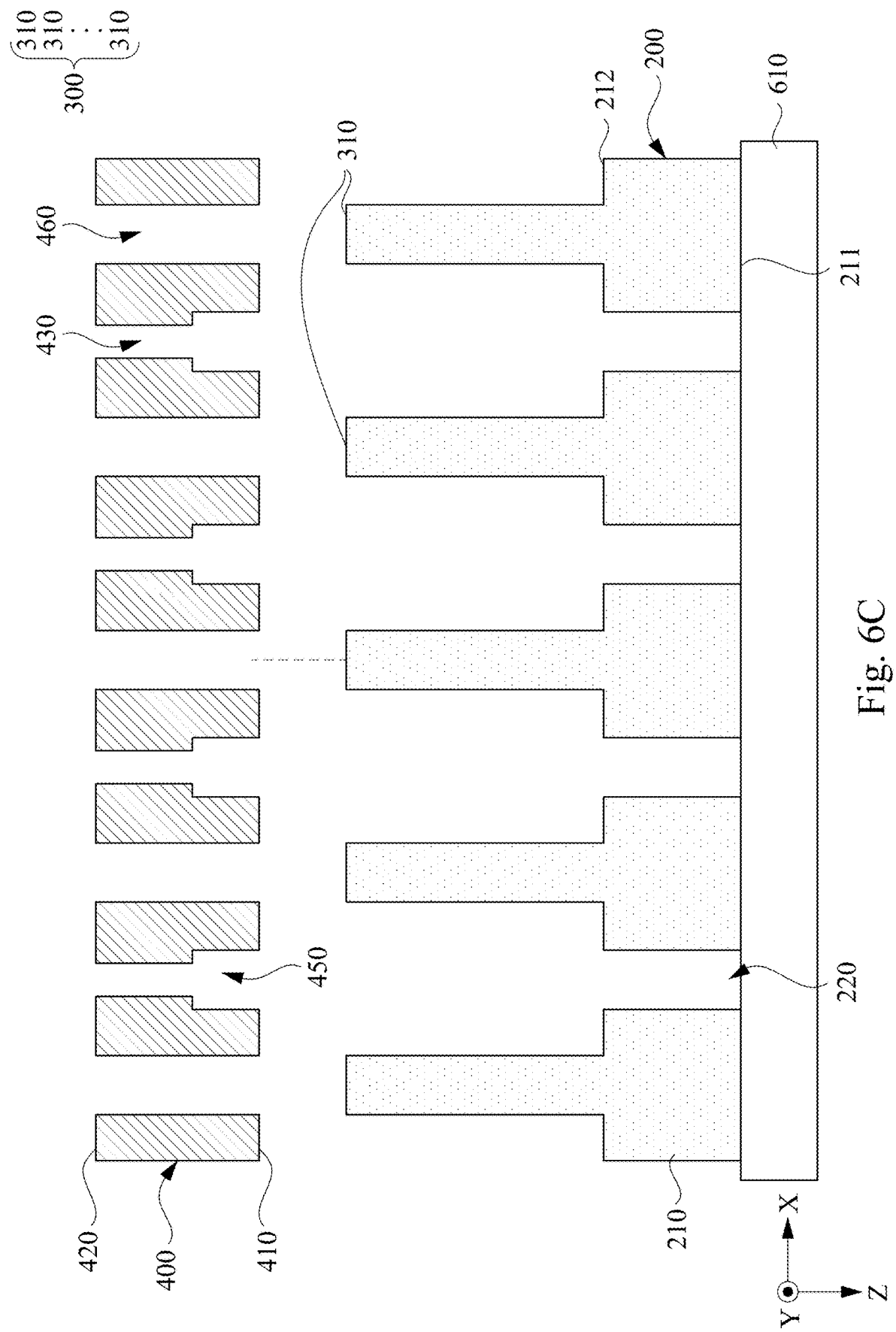
Figure 6D:
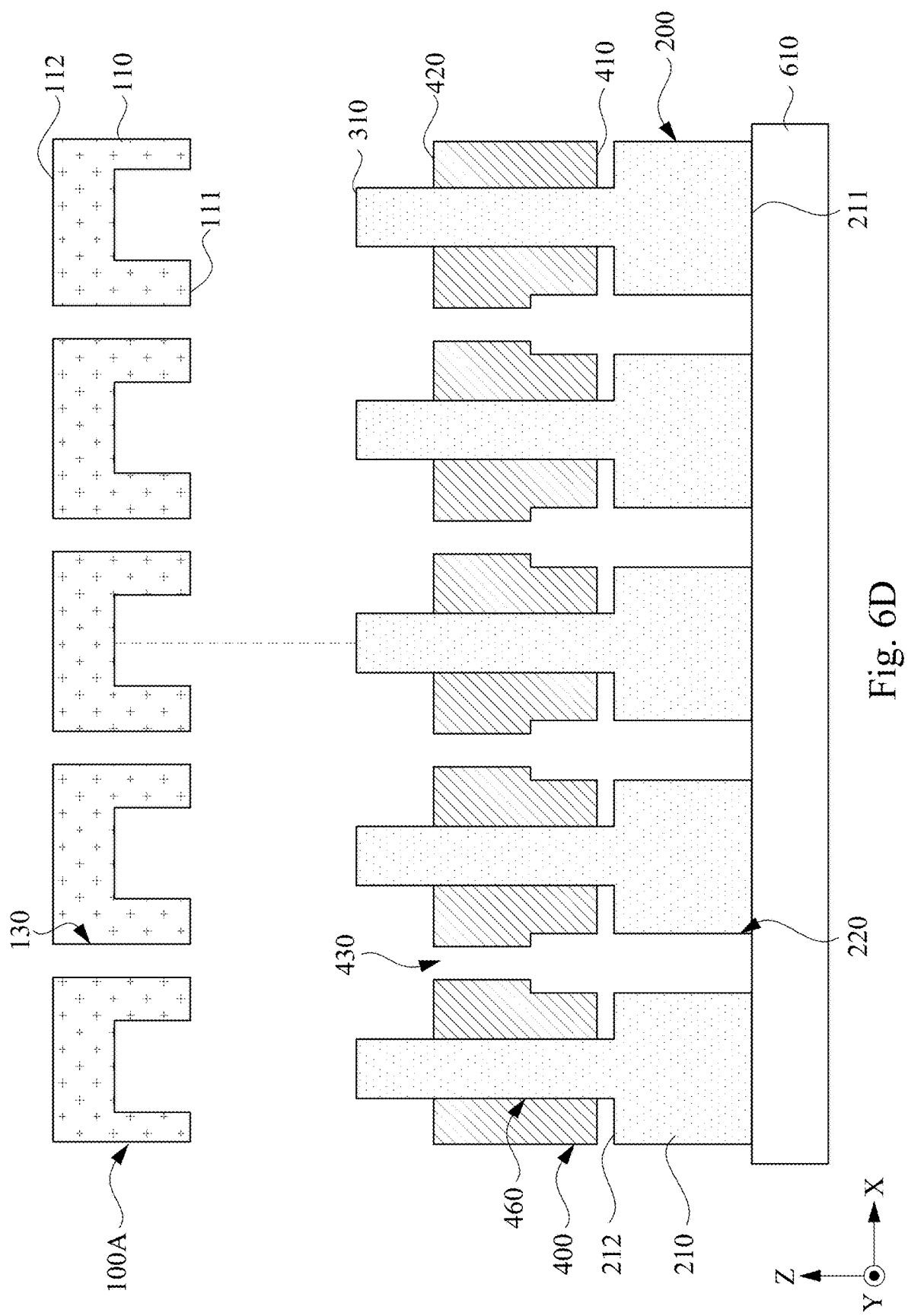
Figure 6E:
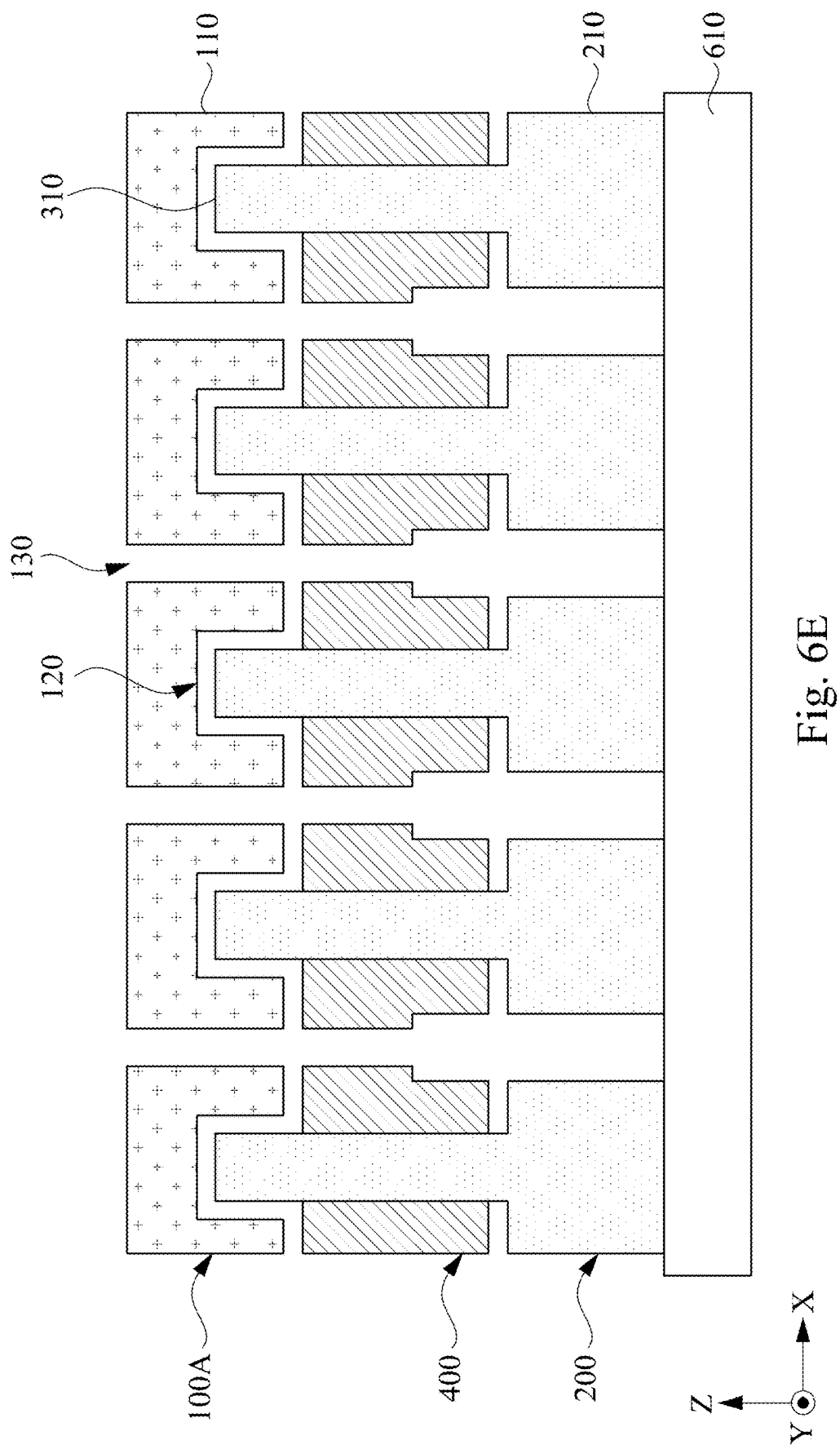
Figure 6F:
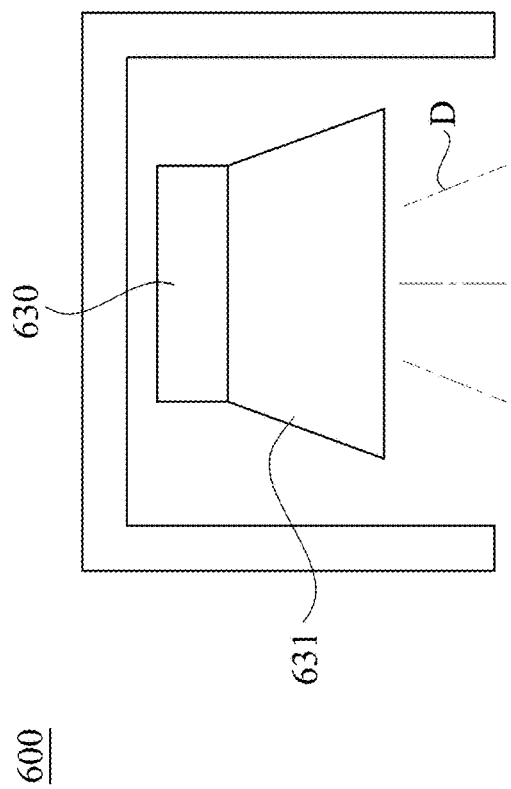
Figure 6F:
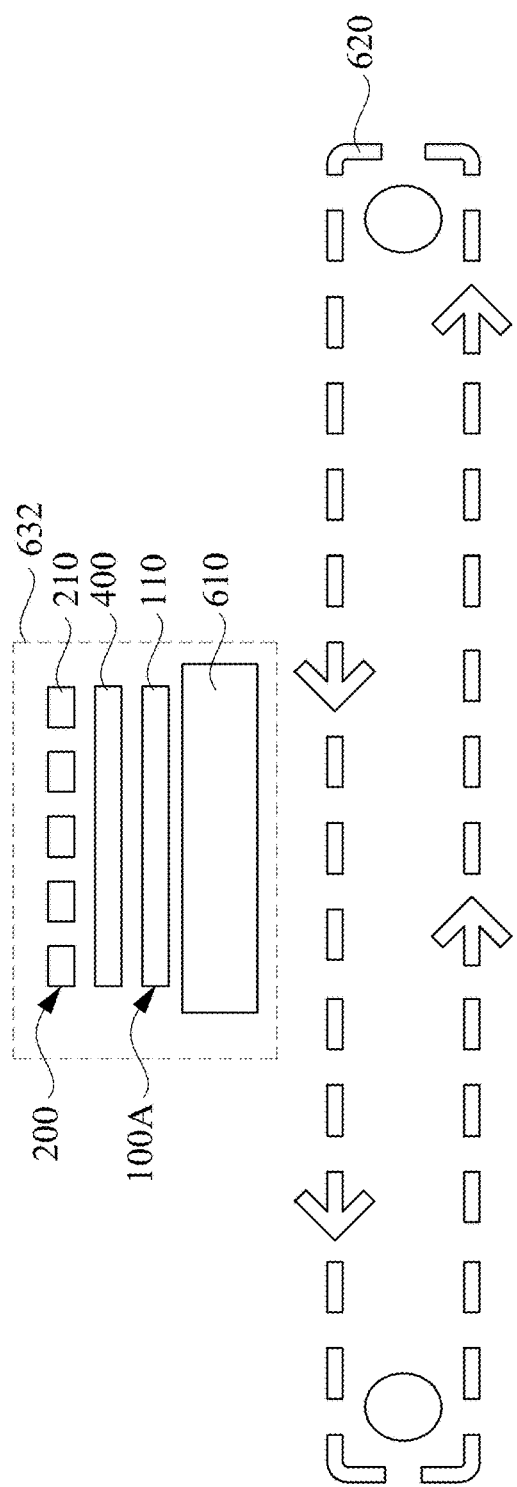

More specifically, the step 504 further includes steps as follows. As shown in FIG. 6C, the upper cover plate 210 is placed on a loading tray 610 wherein the second upper surface 211 is in contact with the loading tray 610, the second lower surface 212 is arranged opposite to the loading tray 610, and each of the positioning pins 310 extends in a direction away from the loading tray 610 (e.g., Z axis). Next, as shown in FIG. 6C and FIG. 6D, the lead frame 400 is placed on the second lower surface 212 of the upper cover plate 210 so that each of the positioning pins 310 of the upper cover plate 210 are respectively inserted into positioning holes 460 of the lead frame 400. Next, as shown in FIG. 6D and FIG. 6E, the lower cover plate 110 is covered on the lead frame 400 and the upper cover plate 210 so that the lead frame 400 is sandwiched between the lower cover plate 110 and the upper cover plate 210 of the sand blasting fixture 11, and the positioning pins 310 of the upper cover plate 210 respectively passing through the lead frame 400 are inserted into pin holes 120 of the lower cover plate 110, respectively. Next, as shown in FIG. 6F, the sand blasting fixture 11 installed with the lead frame 400 is 180° turned over, and then disposed back on the loading tray 610, so that the sandblasting elongated holes 220 of the upper cover plate 210 are arranged opposite to the loading tray 610.

Figure 6G:
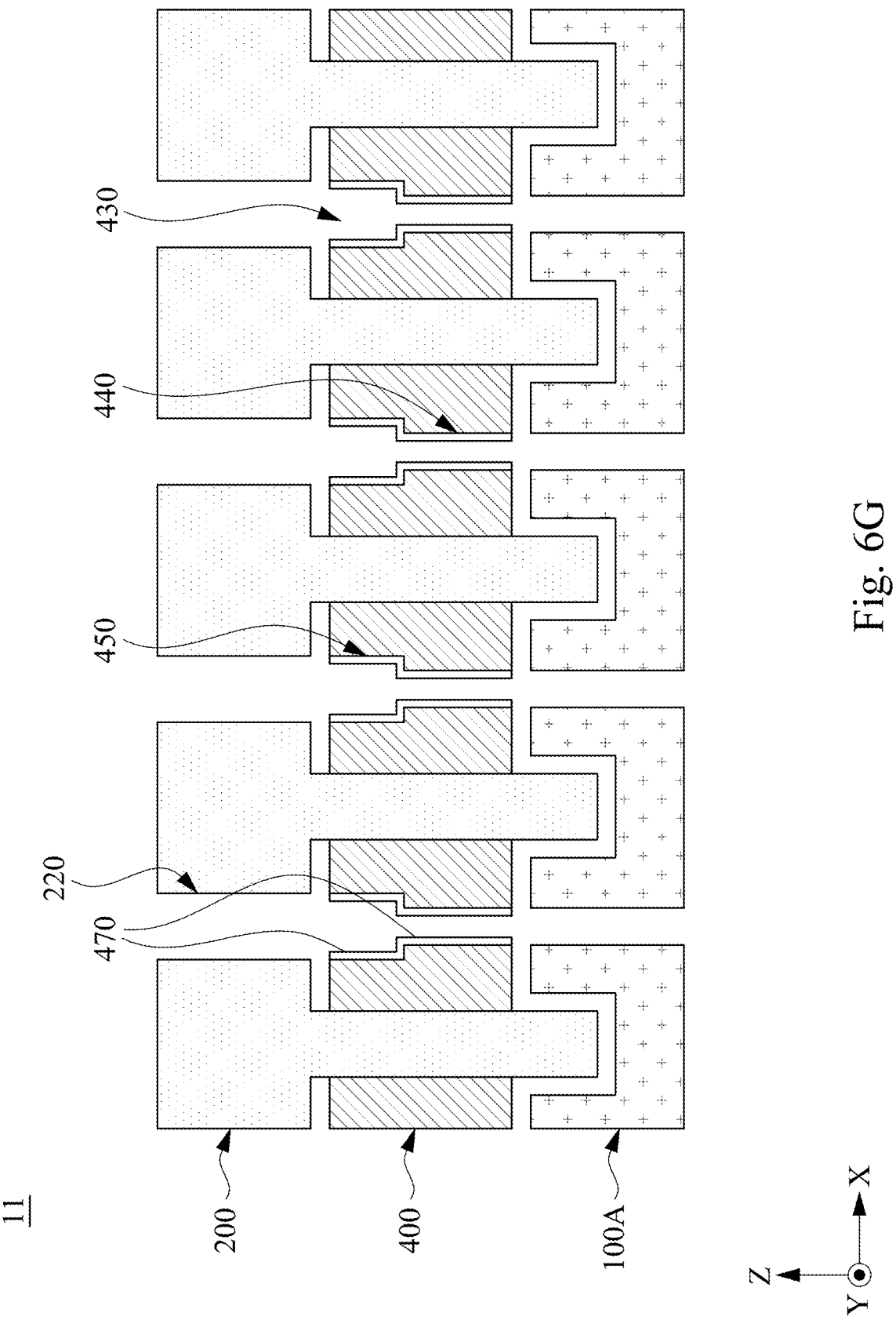

More specifically, the step 505 further includes steps as follows. As shown in FIG. 6F and FIG. 6G, the sand blasting fixture 11 installed with the lead frame 400 therein is moved in a processing range 632 of a dry sandblaster 630. The dry sandblaster 630 is faced towards one of the sandblasting elongated holes 220 of the upper cover plate 210. Next, a large amount of high-pressure sand grains D are sprayed towards the main surface of the sand blasting fixture 11 and each of the half-etched elongated slits 430 in one of the sandblasting elongated holes 220 by using the dry sandblaster 630 so that the elongated step portions 450 are collided so as to form the roughed surfaces 470 on both of the elongated step portions 450 and inner walls of the through trench 440 for enhancing the bonding between the polymer material and the lead frame 400. In this embodiment, the roughness (Ra) is, for example, between 0.5 μm-1.0 μm. However, the disclosure is not limited thereto.

For example, in this embodiment, a roughening equipment 600 includes a conveyor belt device 620 and a dry sandblaster 630. The conveyor belt device 620 is used to drive the above-mentioned loading tray 610 for horizontal movements. For example, the loading tray 610 loaded with the sand blasting fixture 11 having the lead frame 400 therein is moved into the processing range 632 of the dry sandblaster 630. The dry sandblaster 630 is located above the conveyor belt device 620. A nozzle head 631 of the dry sandblaster 630 faces towards the sandblasting elongated holes 220 of the upper cover plate 210, and the nozzle head 631 is used to spray a large amount of high-pressure sand grains D towards the sandblasting elongated holes 220 of the upper cover plate 210, so that the sand grains D entering the half-etched elongated slits 430 in the sandblasting elongated holes 220 can respectively collide with the elongated step portions 450 and the inner walls of the through trench 440 so as to form the corresponding roughed surface 470 at the elongated step portions 450 and the inner walls of the through trench 440, respectively.

More specifically, in one embodiment, a sand injection speed of the dry sandblaster 630 is 5-120 (cm/min), an oscillation frequency of the nozzle head 631 is 5 Hz (Hz)-100 Hz (Hz), and a sandblasting pressure of the dry sandblaster 630 is 0.005 MPa (Mpa)-0.5 MPa (Mpa). However, the present disclosure is not limited thereto.

In one embodiment, the shape of the sand grains D (e.g., abrasive material or sand grains) is granular, beaded, spherical or irregular, however, the present disclosure is not limited thereto. In one embodiment, the material of the sand grains D may include aluminum oxide, silicon oxide, titanium oxide or stainless steel. In one embodiment, the sand grains D include brown alumina #180, brown alumina #280, glass sand #120, rounded steel #120 or/and black alumina #180, however, the present disclosure is not limited thereto.

The size of the brown alumina #280 is 40 to 70 µm, the size of the brown alumina #180 is 63 to 75 µm, the size of the black alumina #180 is 63 to 75 µm, the size of the glass sand #120 has a grain size of 105 to 150 µm, and the rounded steel #120 has a size of 1000 to 1410 µm.

It is noted, the roughening equipment 600 in this embodiment is fixedly installed, but the sand blasting fixture 11 equipped with the lead frame 400 is movable. However, the disclosure is not limited thereto. In other embodiments, the roughening equipment 600 is also possible to be changed as a movable configuration, and the sand blasting fixture 11 equipped with the lead frame 400 is changed as a stationery configuration.

More specifically, in step 506, after the sandblasting operation and the lead frame 400 are removed from the sand blasting fixture 11, as shown in FIG. 6H, a pre-coating procedure is processed to the top surface 410 and the bottom surface 420 of the lead frame 400, respectively so that pre-coating layers 480 are formed on the top surface 410 and the bottom surface 420 of the lead frame 400, respectively.

As shown in FIG. 6I, more specifically, in step 507, the lead frame 400 is press molded, so that one part of the polymer material is located on the pre-coating layer 480 at one side of the lead frame 400, and the other part of the polymer material is infiltrated into the half-etched elongated slits 430 of the lead frame 400 to attach to the roughed surface 470 in the half-etched elongated slits 430; then, a curing process is performed on the polymer material, so that the polymer material integrally forms a package 490 wrapped on the lead frame 400, thus, the aforementioned package lead frame is initially formed. For example, the polymer material is epoxy resin or silicone, however, the disclosure is not limited thereto.

However, the disclosure is not limited thereto. In other embodiments, the method of manufacturing package lead frames of the present disclosure may also adjust the step 506 before the step 504, that is, after the lead frame 400 is pre-coated (step 506), steps 504, 505 and 507 are performed in sequence; or, the pre-coating procedure is directly omitted and the electroplating (known as post-plating) process is performed on the lead frame 400 only after step 507.

Thus, through the construction of the embodiments above, the sand blasting fixture of the disclosure allows a part of sandblasting operations to be performed with high precision, that is half-etched elongated slits opened on an outer surface of the lead frame can be accurately exposed. Thus, since outer surface of the lead frame can be prevented from being unintentionally exposed, the smoothness of the outer surface of the lead frame can be maintained, and the brightness of the product can be kept and leakage can be improved together, thereby improving the yield, reliability and packaging reliability of the lead frame.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure covers modifications and variations of this disclosure provided they fall within the scope of the following claims and their equivalents.

What is claimed is:

1. A method of manufacturing package lead frames, comprising:
   providing a lead frame;
   forming a through trench on the lead frame;
   performing a half etching process on the lead frame so that at least one elongated step portion is concavely formed on an outer side of the through trench, wherein the at least one elongated step portion is in communication with the through trench to form a half-etched elongated slit together;
   installing the lead frame inside a sand blasting fixture, wherein the lead frame is sandwiched between a lower cover plate and an upper cover plate of the sand blasting fixture, and the upper cover plate completely covers one surface of the lead frame to allow the half-etched elongated slit to be completely overlapped and exposed to a sandblasting elongated hole of the upper cover plate;
   performing a sandblasting operation on the half-etched elongated slit by means of the sandblasting elongated hole, so that a roughed surface is formed on the at least one elongated step portion;
   forming a pre-coating layer onto the lead frame; and
   performing a press-molding process to the lead frame so that a polymer material is attached to the half-etched elongated slit and the roughed surface.

2. The method of manufacturing package lead frames of claim 1, wherein the sandblasting operation on the half-etched elongated slit is performed only after forming the pre-coating layer onto the lead frame.

3. The method of manufacturing package lead frames of claim 1, wherein forming the pre-coating layer onto the lead frame is performed only after removing the sand blasting fixture from the lead frame.

4. The method of manufacturing package lead frames of claim 1, wherein performing the sandblasting operation on the half-etched elongated slit further comprises:
   moving the sand blasting fixture installed with the lead frame therein in a processing range of a dry sandblaster, wherein the dry sandblaster is faced towards the sandblasting elongated hole of the upper cover plate; and
   using the dry sandblaster to spray a plurality of sand grains into the half-etched elongated slit in the sandblasting elongated hole so as to collide with the at least one elongated step portion to form the roughed surface.

5. The method of manufacturing package lead frames of claim 1, wherein installing the lead frame inside the sand blasting fixture further comprises:
   placing the upper cover plate on a loading tray so that a lower surface of the upper cover plate is arranged opposite to the loading tray;
   placing the lead frame on the lower surface of the upper cover plate so that positioning pins of the upper cover plate are respectively inserted into positioning holes of the lead frame;
   covering the lower cover plate on the lead frame and the upper cover plate so that the lead frame is sandwiched between the lower cover plate and the upper cover plate of the sand blasting fixture, and the positioning pins of the upper cover plate respectively passing through the lead frame are inserted into pin holes of the lower cover plate, respectively; and
   turning over and disposing the sand blasting fixture installed with the lead frame back on the loading tray, so that the sandblasting elongated hole of the upper cover plate is arranged opposite to the loading tray.

* * * * *